United States Patent
Cheng et al.

[11] Patent Number: 5,730,611
[45] Date of Patent: Mar. 24, 1998

[54] CARD EDGE CONNECTOR WITH PROTECTIVE HIDDEN LOCKING LUG OF EJECTOR

[75] Inventors: Lee-Ming Cheng, Cupertino; Edmond Choy, Union City, both of Calif.

[73] Assignee: Hon Hai Precision Ind. Co., Ltd., Taiwan

[21] Appl. No.: 732,661

[22] Filed: Oct. 15, 1996

Related U.S. Application Data

[63] Continuation-in-part of Ser. No. 673,070, Jul. 1, 1996, Pat. No. 9,672,069.
[51] Int. Cl.[6] ........................................... H01R 13/62
[52] U.S. Cl. ................................. 439/160; 439/157
[58] Field of Search ................................ 439/152–160

[56] References Cited

U.S. PATENT DOCUMENTS

| | | | |
|---|---|---|---|
| 5,429,523 | 7/1995 | Tondreault | 439/157 |
| 5,470,242 | 11/1995 | Cheng et al. | 439/157 |
| 5,511,985 | 4/1996 | Noschese et al. | 439/157 |
| 5,558,528 | 9/1996 | Cheng et al. | 439/155 |

*Primary Examiner*—Gary F. Paumen
*Assistant Examiner*—Brian J. Biggi

[57] ABSTRACT

A card edge connector (10) includes an insulative elongated housing (12) having a central slot (14) for receiving the corresponding card (100) and having at least one ejector (20) at its longitudinal end. The ejector (20) comprises a kicker (32) at the bottom for engagement with the bottom edge of the card (100) received within the connector (10). The ejector (20) further includes a locking projection (30) horizontally and inwardly projecting toward the central slot (14) for engagement within a notch (104) of the inserted card (100). A pair of retention bars (22) or restraint devices for limiting lateral movement of the inserted card with regard to housing (12), vertically extend by two sides of the central slot (14) adjacent the ejector (20). The pair of retention bars (22) extend over the locking projection (30) of the ejector (20) in the vertical direction for substantially protectively covering the locking projection (30) in the vertical and/or horizontal direction. Moreover, the action region of the retention bars' (22) against the card (100) is located above the notch (104) thereof and the corresponding locking projection (30). Therefore, the retention effect is more balanced in comparison with that in the parent application, of which the connector has the locking projection engaging the notch of the card above the action region of the retention bars.

8 Claims, 10 Drawing Sheets

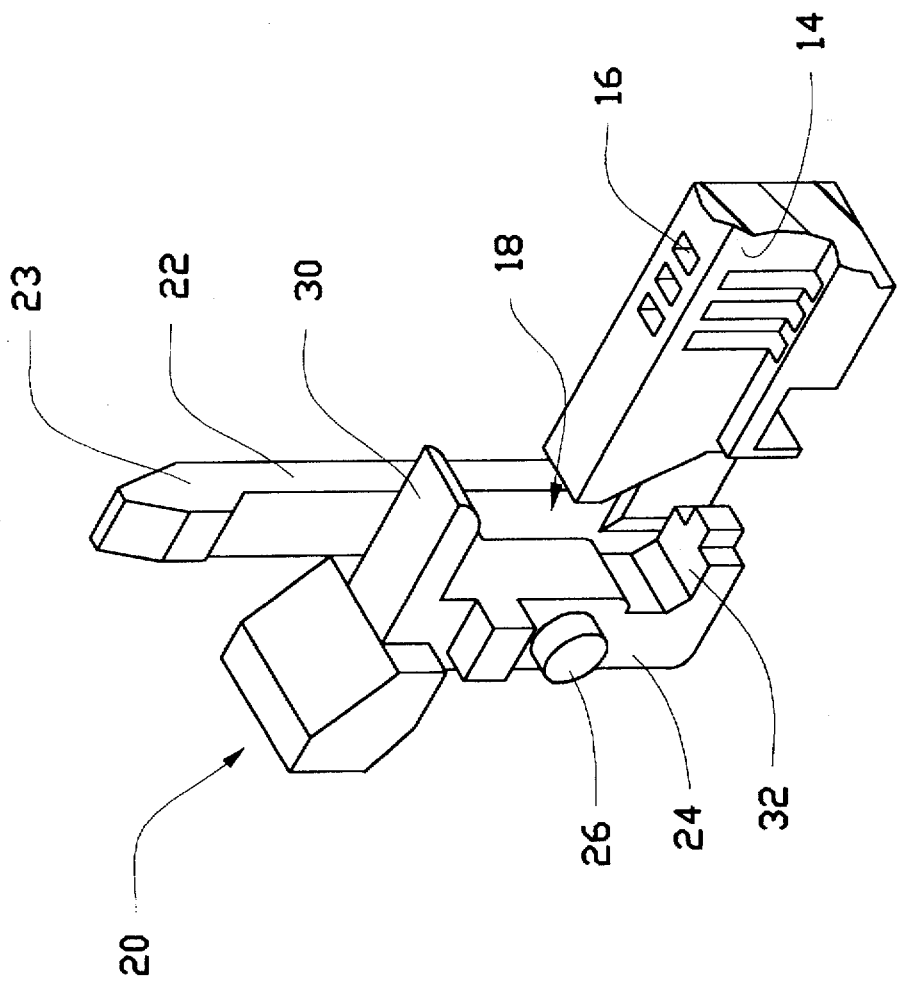

CARD EDGE CONNECTOR WITH PROTECTIVE HIDDEN LOCKING LUG OF EJECTOR

This application is a continuation-in-part of application Ser. No. 08/673,070 filed Jul. 1, 1996, now U.S. Pat. No. 5,672,069, of which the specification is incorporated by reference into this specification.

BACKGROUND OF THE INVENTION

1. Field of the Invention

The invention relates to card edge connectors, and particularly to the card edge connector with at least one ejector adjacent one end wherein such ejector includes a locking lug for latchable engagement within a notch in the card inserted within the connector, and such locking lug is substantially protectively hidden from an exterior.

2. The Related Art

The copending parent application discloses the ejector of the card edge connector having a locking lug for engagement within a notch of the card received within the card connector. Anyhow, the horizontally projecting locking lug generally is positioned at the upper portion of the ejector and is substantially exposed to an exterior, (i.e., referring to figures of the copending parent application, the width of the locking lug being substantially larger than the thickness of the card and then the locking lug laterally projecting out of two sides of the card), and thus sometimes it is easy for a computer assembly operator to inadvertently touch such exposed locking lug and mistakenly loosen the original locking function of the locking lug of the ejector. Secondly, for some higher profile cards, the locking lug of the ejector and a pair of the retention bars, which are substantially positioned below the locking lug, can not efficiently retain such higher profile card in a fixed position, especially during a vibration situation. This problem may result in signals intermittence between the contacts of the connector and the circuit pads on the card.

Therefore, an object of the invention is to provide a card edge connector adapted to receive a higher profile card therein, and having at least one ejector, equipped with a locking lug, at one longitudinal end of the connector housing. Such locking lug is substantially protectively hidden from directly exposure to an exterior in a vertical direction and/or a horizontal direction whereby the locking lug will not tend to be influenced by an inadvertent impact from the top, and means which protects the locking lug, provides a superior retention performance for the higher profile card.

SUMMARY OF THE INVENTION

According to an aspect of the invention, a card edge connector includes an insulative elongated housing having a central slot for receiving the corresponding card and having at least one ejector at its longitudinal end. The ejector comprises a kicker at the bottom for engagement with the bottom edge of the card received within the connector. The ejector further includes a locking projection horizontally and inwardly projecting toward the central slot for engagement within a notch of the inserted card. A pair of retention bars or restraint devices for limiting lateral movement of the inserted card with regard to housing, vertically extend by two sides of the central slot adjacent the ejector. The pair of retention bars extend over the locking projection of the ejector in the vertical direction for substantially protectively covering the locking projection in the vertical and/or horizontal direction. Moreover, the action region of the retention bars against the card is located above the notch thereof and the corresponding locking projection. Therefore, the retention effect is more balanced in comparison with that in the parent application, of which the connector has the locking projection engaging the notch of the card above the action region of the retention bars.

BRIEF DESCRIPTION OF THE DRAWINGS

FIG. 2(A) is a fragmentary perspective view of the card edge connector of FIG. 1 to show how the ejector is received within the cavity in a vertical position wherein the locking projection is generally positioned under the expansion lugs of the retention bars by two sides.

DETAILED DESCRIPTION OF THE PREFERRED EMBODIMENTS

Figure 1:
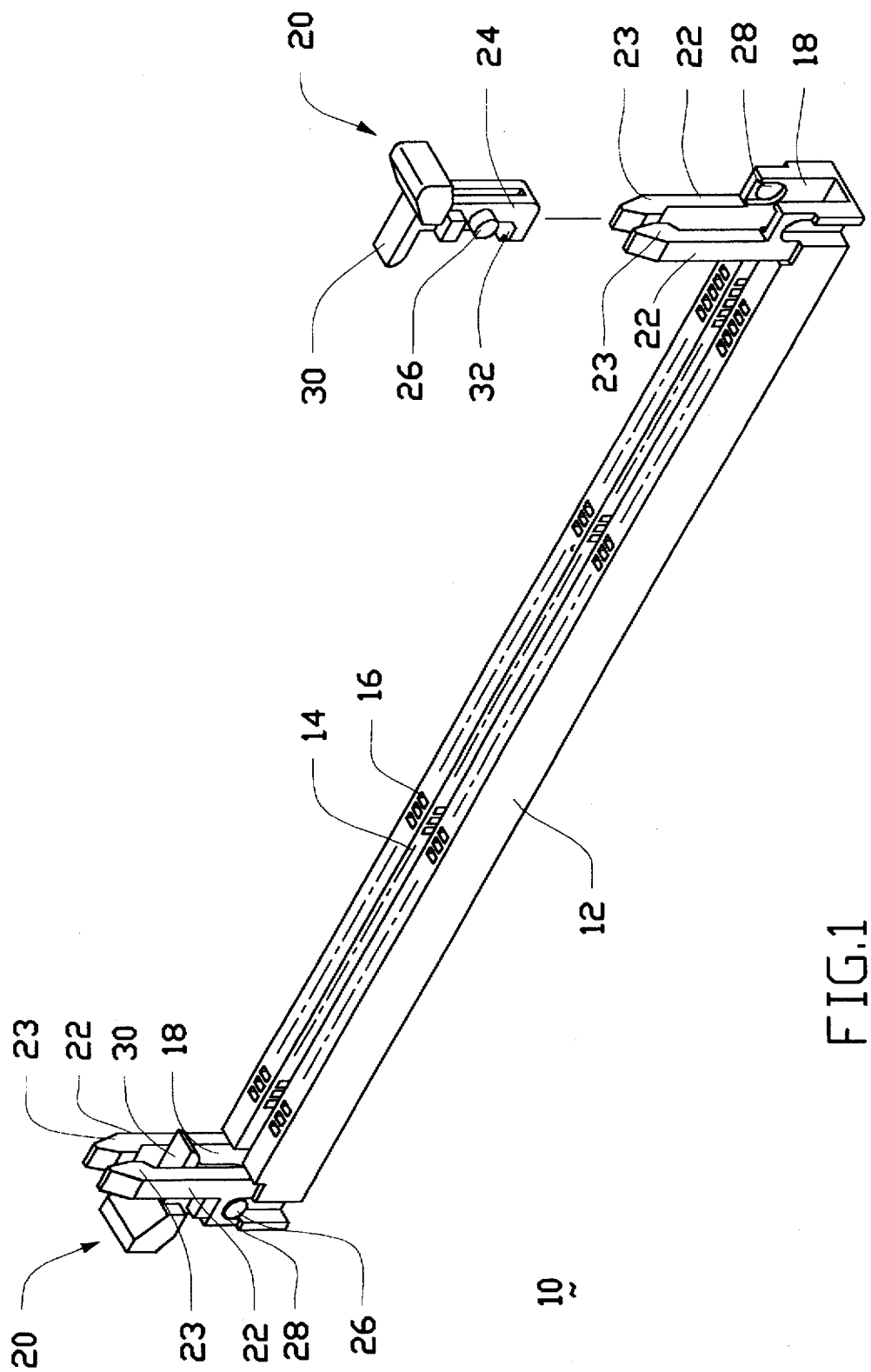
FIG. 1 is a perspective view of a preferred embodiment of a card edge connector according to the present invention wherein one of the ejector has been removed therefrom to show the corresponding cavity therein.
Figure 1A:
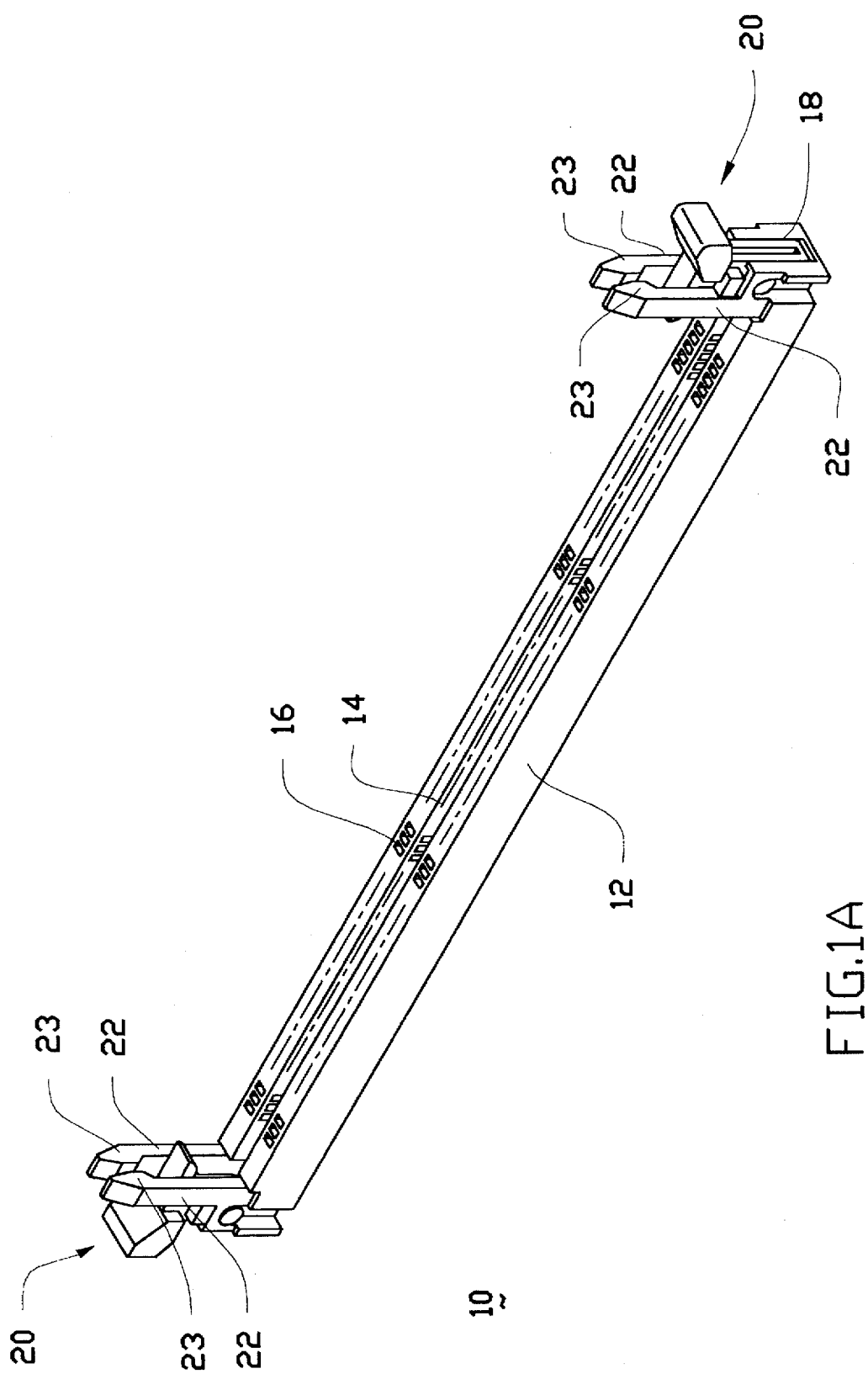
FIG. 1(A) is a perspective view of the assembled card edge connector of FIG. 1.
Figure 2B:
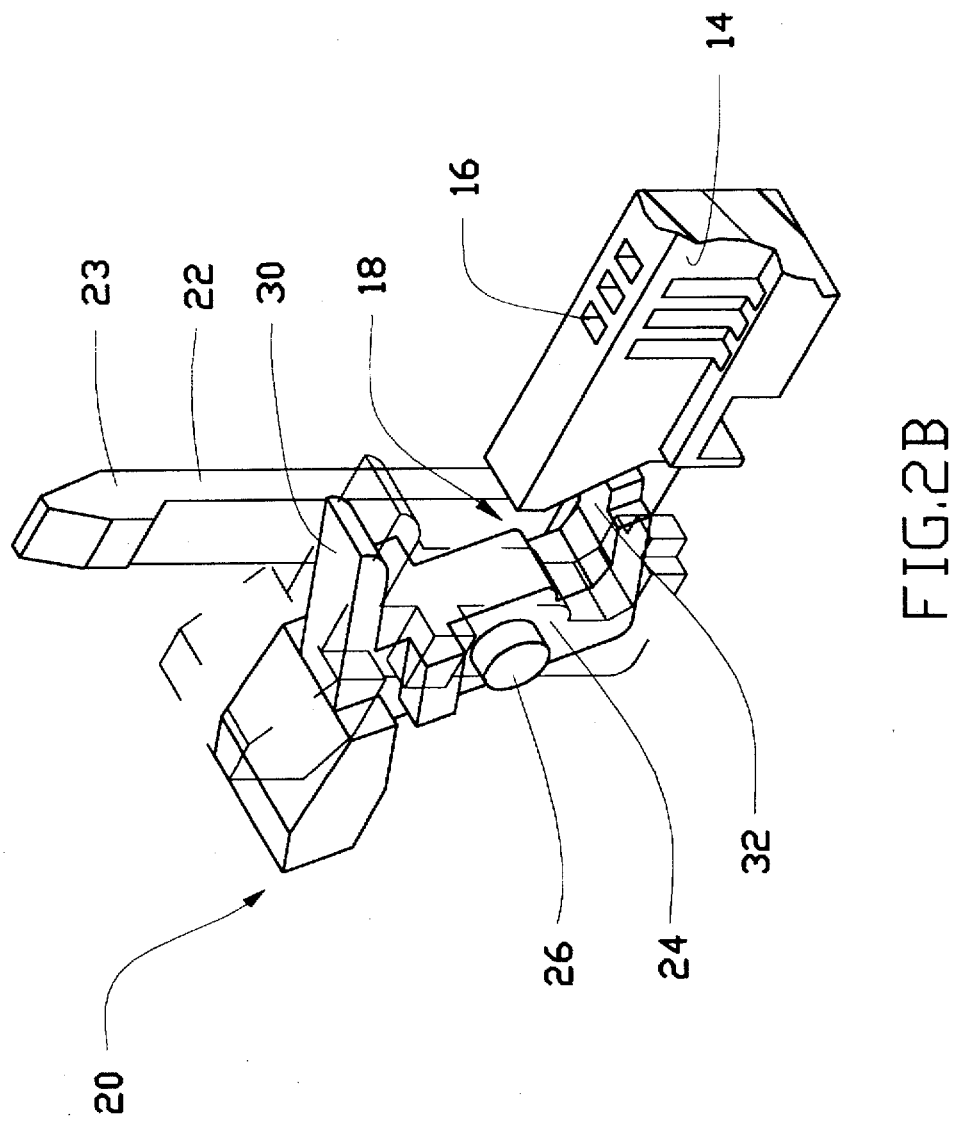
FIG. 2(B) is a fragmentary perspective view of the card edge connector of FIG. 1 to show how the ejector may be rotatably moved to a slanted position without interference with the expansion lugs of the retention bars by two sides.
Figure 3A:
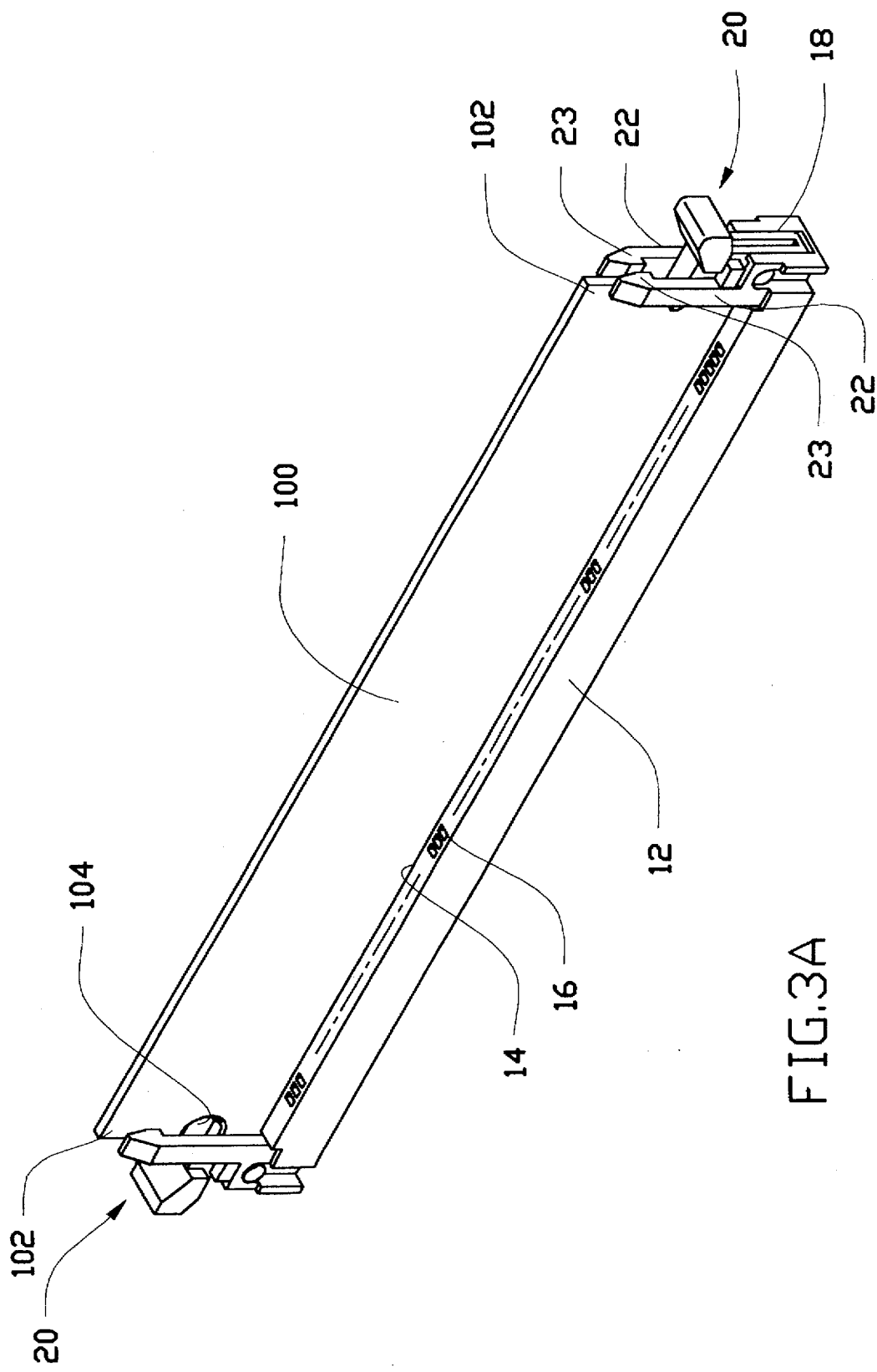
FIG. 3(A) is a perspective view of the card edge connector of FIG. 1 to show how the ejector is received within the cavity to lock a card in the connector wherein the locking projection is received within the notch of the card and substantially under the expansion lugs of the retention bars by two sides.
Figure 3B:
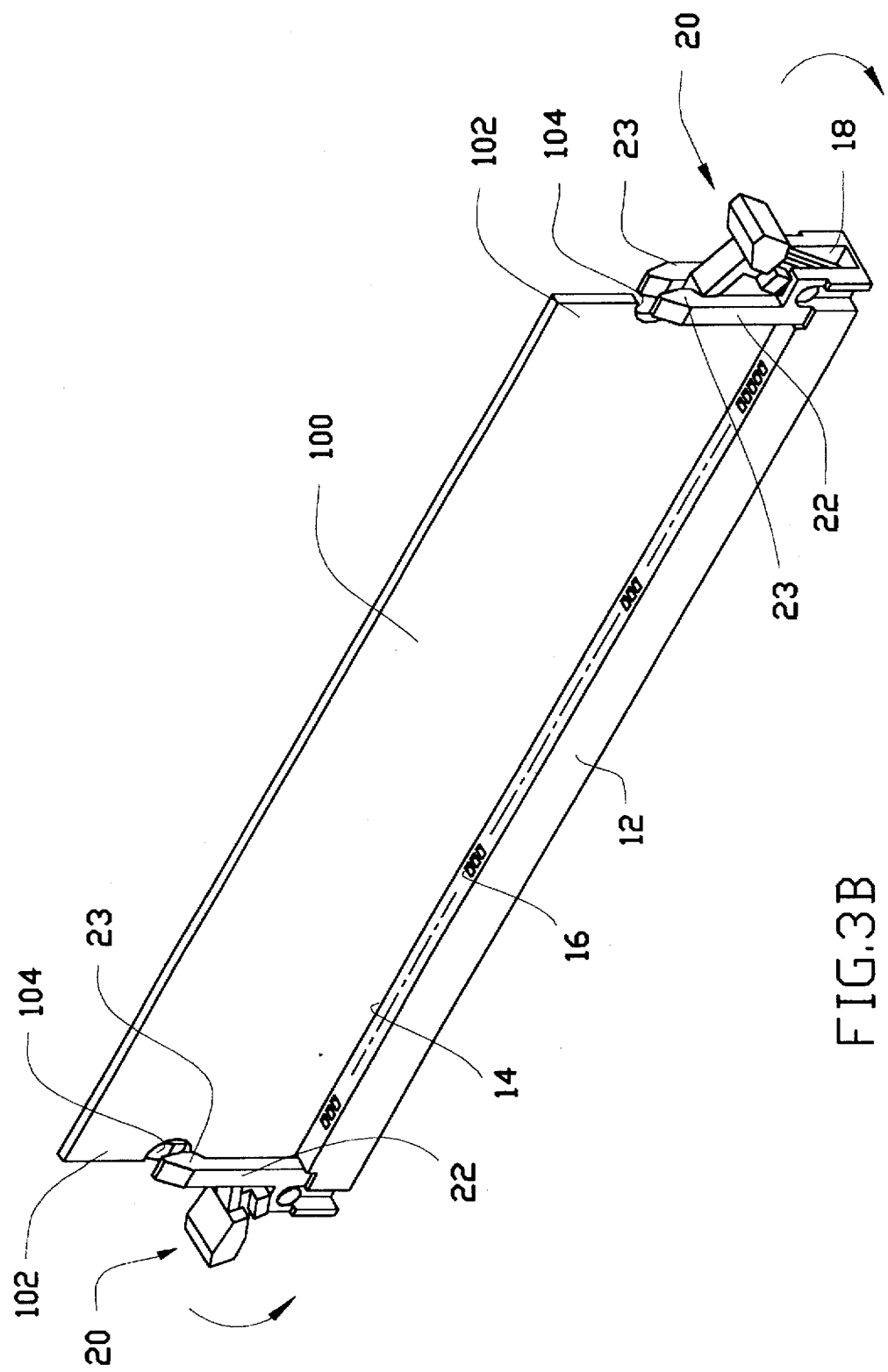
FIG. 3(B) is a perspective view of the card edge connector of FIG. 1 to show how the ejector ejects the inserted card out of the connector by its rotatable movement.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is directed to FIGS. 1–3(B) wherein a card edge connector 10 includes an insulative elongated housing 12 defining a central slot 14 therein along its longitudinal direction for receiving a card 100 (FIGS. 3(A) and 3(B)) therein. A plurality of passageways 16 are disposed by two sides of the slot 14 for receiving a corresponding number of contacts (not shown) therein for engagement with the corresponding circuit pads on the bottom portion of the inserted card 100.

A cavity 18 is formed adjacent either end of the housing 12 for receiving therein a corresponding ejector 20 which is adapted to be rotatably moved with regard to the housing 12. A pair of extended retention bars 22 vertically project beside the corresponding cavity 18 wherein the space defined between this pair of extended retention bars 22 is generally aligned with the central slot 14 so that when the card 100 is received within the central slot 14, the side edge portion 102 may be sandwiched by a pair of expansion lugs 23 respectively positioned at the top of this pair of extended retention bars 22.

Similar to the copending parent application, the ejector 20 includes a main body 24 with two pivotal knobs 26 on two sides for engagement within the corresponding pivotal holes 28 in the housing 12 beside the cavity 18. The ejector 20 further includes a locking projection 30 at the top portion of the main body 24, and the kicker 32 at the bottom portion of the main body 24. Corresponding to the locking projection 30, the card 100 includes a notch 104 in its side edge portion 102.

Understandably, when the card 100 is ready to be inserted into the central slot 14 of the housing 12 of the connector 10, the ejector 20 should be in an open slanted position. Once the card 100 is moved downwardly and inserted deeply, the bottom edge of the card 100 will confront the kicker 32 of the ejector 20 and successively presses it down until the card 100 is in its final engagement position with regard to the contacts by two sides of the slot 14. During this period, the ejector 20 is rotatably moved within the cavity 18, and eventually moved to a final vertical locking position whereby the locking projection 30 can be latchably received within the corresponding notch 104 of the card 100. Under this situation, the locking projection 30 is substantially and exactly positioned under the expansion lugs 23. In other words, the expansion lugs 23 engage the corresponding side edge portion 102 above the notch 104 of the card 100.

Oppositely, when the card 100 is intended to be withdrawn from the connector 10, by pressing down the lever 34 of the ejector 20, the ejector 20 can be rotatably moved within the cavity 18. The locking projection 30 is rotatably moved outwardly for releasing the latching function to the notch 104 of the card 100, and simultaneously the kicker 32 will rotatably move upwardly to push the bottom edge of the card 100 upward for disengagement of the contacts of the connector 10 with the circuit pads of the card 100. Therefore, the card 100 can be withdrawn from the housing 12 of the connector 10.

It can be noted that one feature of the invention is to provide a pair of upwardly extended higher/longer retention bars 22 in place of the lower retention bars disclosed in the copending parent application. This arrangement has the expansion lugs 23 sandwich the side edge portion 102 of the card 100 substantially above the notch 104 of the card 100 in the vertical direction. In the copending parent application, the retention bars engage the card under the notch of the card.

Therefore, in this application, other than the sandwiching engagement provided by the contacts (not shown) in the central slot 14, the upper sandwiching retention effect is implemented by the higher expansion lugs 23, in comparison with the copending parent application, and thus resulting in a more efficient retention structure arrangement than the parent application. Moreover, such upper sandwiching retention effect by the expansion lugs 23 and the lower sandwiching retention effect by the contact (not shown) in the central slot 14, are respectively positioned in two opposite directions of the notch 104 and the locking projection 30. Therefore, the transverse retention, i.e., the upper sandwiching retention by the expansion lugs 23 and the lower sandwiching retention by the contact (not shown), may provide a balanced mechanical arrangement with regard to the vertical retention, i.e., the locking projection 30 to the notch 104, especially in a relatively great vibration condition.

It is also noted that to correspond to the longer or extended retention bars 22 in place of the shorter retention bars in the previous parent application, the expansion lugs 23 are substantially structurally positioned above the locking projection 30 when the ejector 20 is in a final vertical position. The relative positions between the expansion lugs 23 of the retention bars 22 and the locking projection 30 of the ejector 20 are carefully arranged for no interference therebetween during rotation of the ejector 20 with regard to housing 12. In other words, a sufficient space is reserved between the bottom portion of the expansion lugs 23 and the top portion of the locking projection 30 when the ejector 20 is positioned in a vertical locking state, whereby no interference between these two confronting portions will occur during outward rotation of the ejector 20.

Additionally, to most other conventional card edge connectors with rotatable ejectors, because no proper sandwiching retention provided along the card during the ejection/withdrawal process, the card may be easily sprung from the corresponding connector if a quick and large force applied to the lever of the ejector, and may be uncontrollably dropped to the ground, resulting in an unexpected damage. Differently, in the application, the higher expansion lugs 23 may provide a somewhat retardant effect, thus assuring that the card 100 may be still engaged with the expansion lugs 23 of the retention bars 22 even after the card 100 has been upward pushed by the kicker 32 of the fully opened ejector 20 in a distance and disengaged from the contacts in the central slot 14. Then, the operator can easily and calmly snap the top edge portion of the card 100 and withdraw the card 100 completely from the connector 10. This procedure prevents any unexpected hasty withdrawal of the card 100 from the connector housing 12.

Another feature of the invention is that the locking projection 30 of the ejector 20 is protectively embedded and hidden within the space between the pair of retention bars 22 and under the expansion lugs 23, i.e., the engagement between the locking projecting 30 of the ejector 20 and the notch 104 of the card 100 being not directly exposed to an exterior, in order not to be inadvertently impacted by the external factor which exerts influence directly on the engagement between the locking projection 30 of the ejector 20 and notch 104 of the card 100.

Figure 4A:
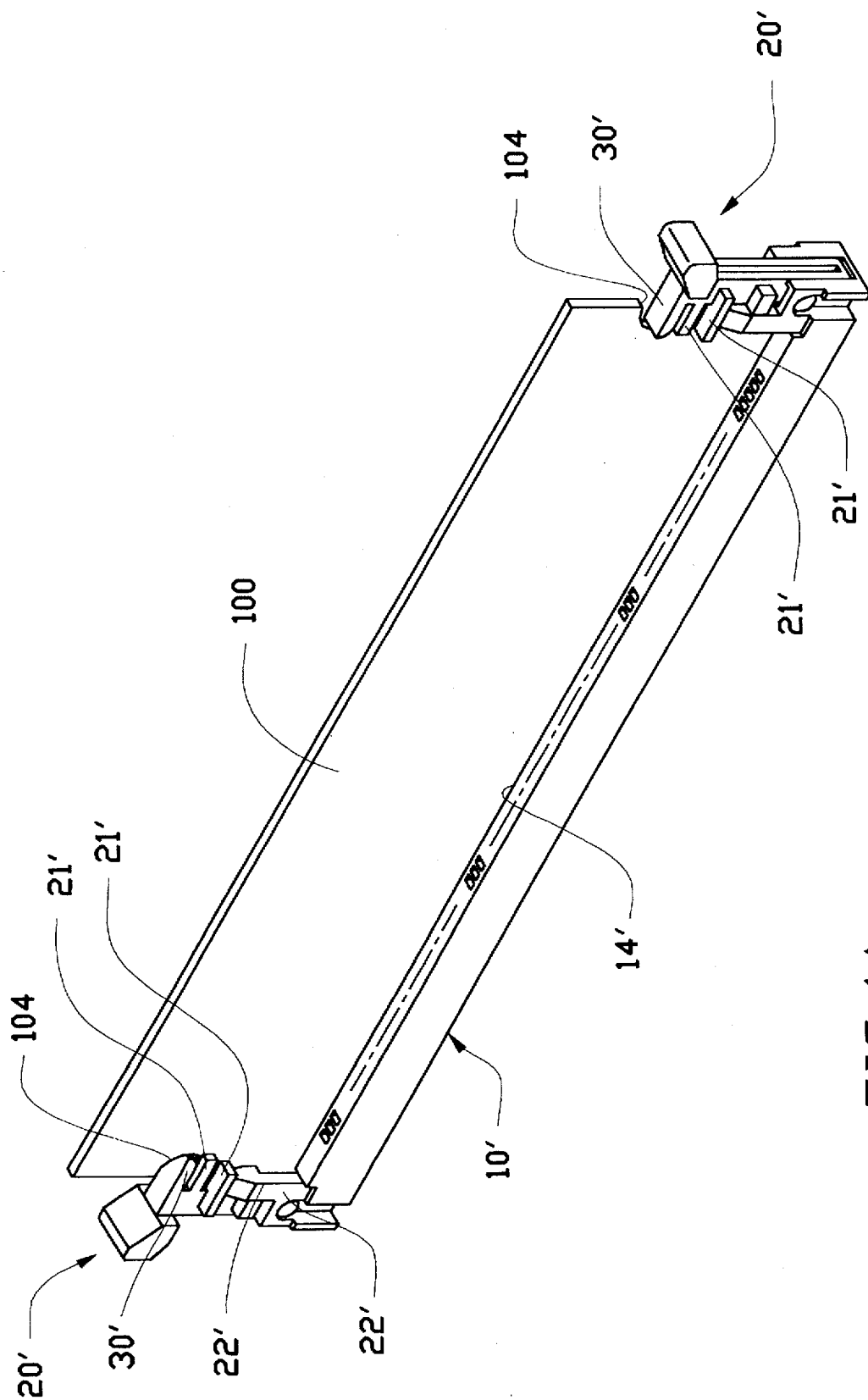
FIG. 4(A) is a perspective view of a second embodiment of a card edge connector with ejectors wherein the ejector itself has retention mechanism below its locking projection for retaining the card in the transverse direction.
Figure 4B:
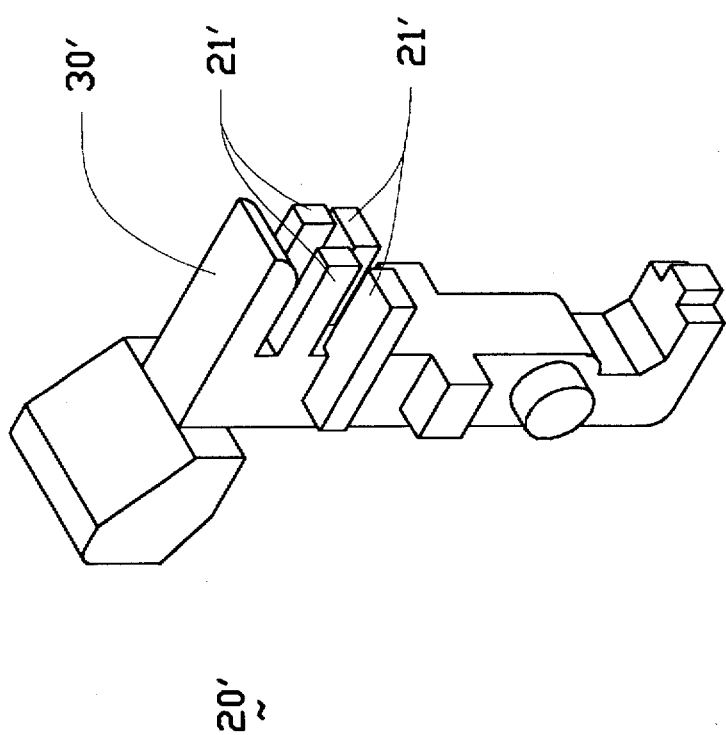
FIG. 4(B) is an enlarged perspective view of the ejector of the connector of FIG. 4(A).

FIGS. 4(A) and 4(B), which generally result from FIGS. 7 and 6 of the parent application, disclose another embodiment of the ejector 20' for use with the corresponding card edge connector 10', and such ejector 20' has the retention device 21' substantially above the locking projection 30' for retainably sandwiching the corresponding side region of the card 100 below the notch 104 thereof. Also, the retention bars 22' are of a shorter type so that the locking projection 30' and the associated retention device 21 of the ejector 20' are generally positioned above the expansion lugs 23' of the retention bars 22'.

Figure 5A:
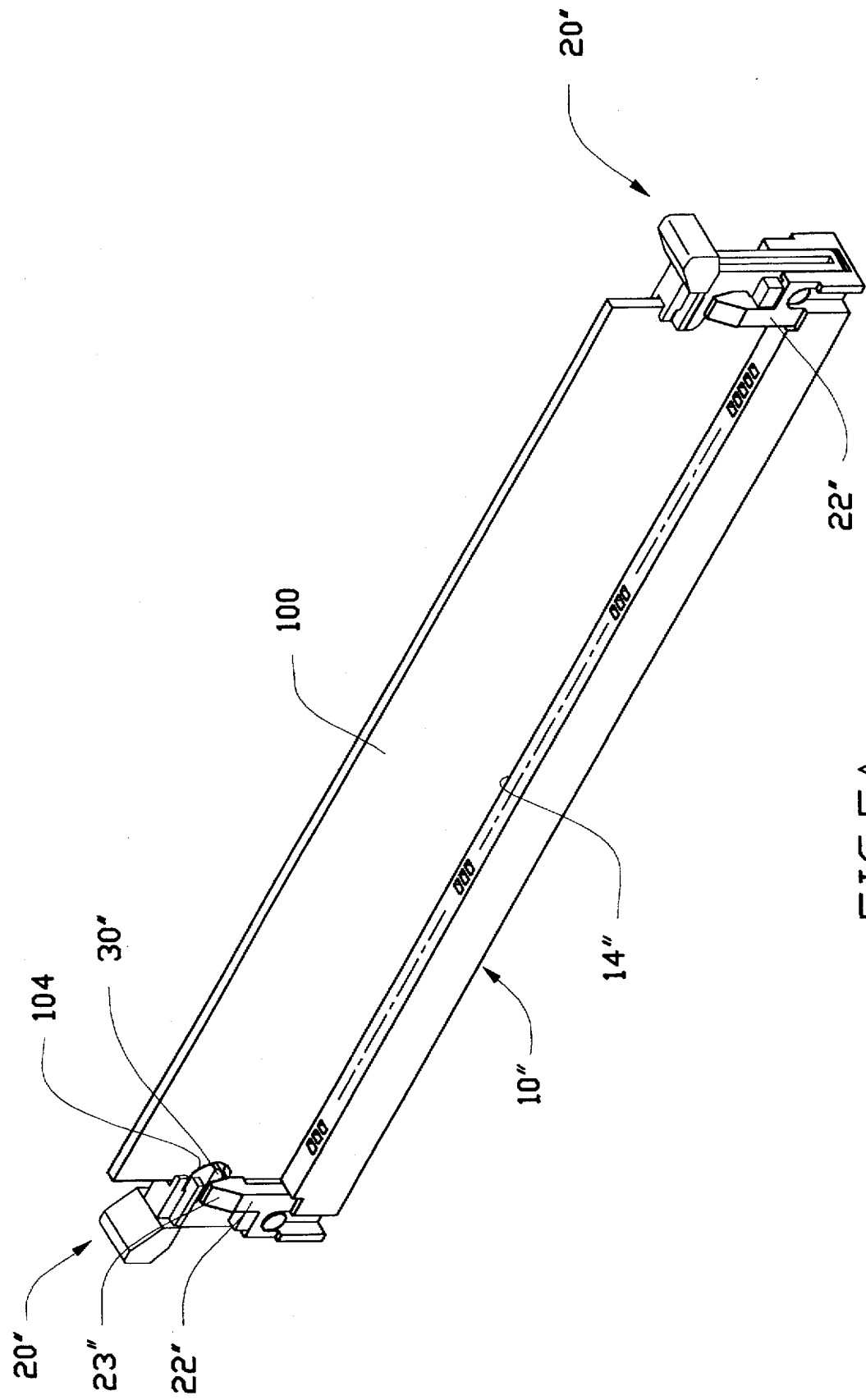
FIG. 5(A) is a perspective view of a third embodiment of the card edge connector with ejectors wherein the ejector itself has retention mechanism above its locking projection for retaining the card in the transverse direction.
Figure 5B:
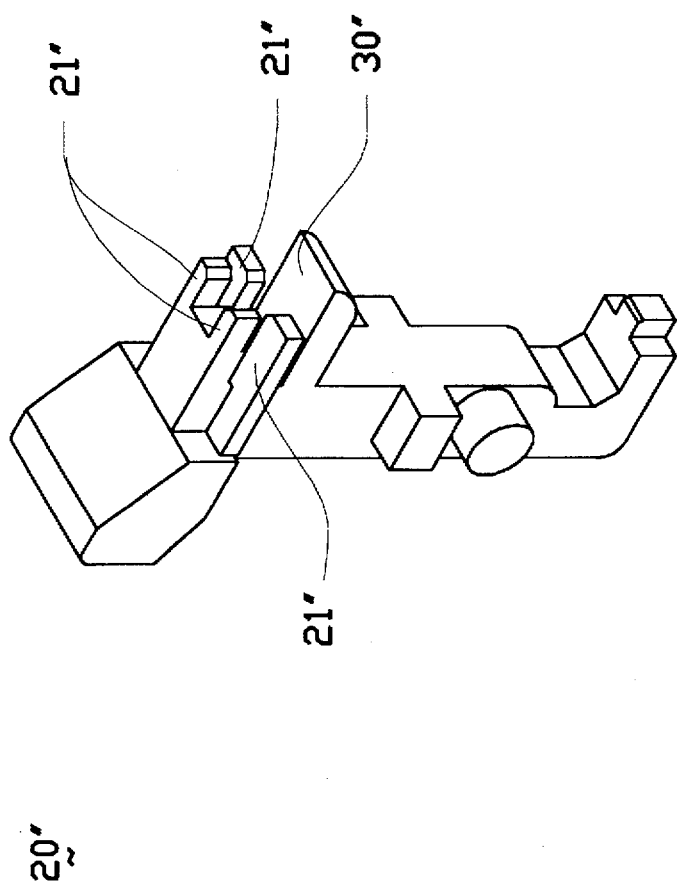
FIG. 5(B) is an enlarged perspective view of the ejector of the connector of FIG. 5(A).

FIGS. 5(A) and 5(B) disclose another type ejector 20" incorporating the connector 10" of FIG. 4(A) and having retention device 21" positioned above the locking projection 30" for sandwiching the side edge portion 102 of the card 100 above the notch 104 in which the locking projection 30" is embedded. In this situation, the retention device 21" cooperates with the expansion lugs 23" of the pair of shorter type retention bars 22" of the connector 10" may provide a very sufficient retention effect for the sandwiched card 100. It will be appreciated that in this embodiment, the shorter type retention bars 22" may be omitted for simplifying the manufacturing of the connector housing 12", while the retention device 21" cooperates with the contacts in the central slot 14" may also provide a balanced and sufficient transverse retention on two opposite directions of the notch 104 of the card 100.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. A card edge connector for use with a card, comprising:
   an insulative elongated housing defining a central slot for receiving said card therein;
   a plurality of passageways positioned by two sides of the central slot for receiving a corresponding number of contacts therein for engagement with the card;
   at least a cavity formed adjacent one longitudinal end of the housing;
   at least an ejector adapted to be positioned within said cavity;
   said ejector including a main body, a kicker on a bottom portion thereof, and a locking projection on a top portion thereof;
   at least a pair of retention bars formed integrally with said housing and positioned beside the cavity along a longitudinal direction of said housing;
   said retention bars further respectively including a pair of upper ends whereby, when the card is fully embedded within the connector housing, the locking projection is latchably engaged within a notch of a side edge portion of the card wherein the locking projection is substantially positioned under said upper ends of the retention bars, and said upper ends of the retention bars engage the side edge portion above the notch.

2. The connector as defined in claim 1, wherein transverse retention provided by the retention bars and the contacts are respectively positioned on two opposite sides with regard to vertical retention provided by the locking projection.

3. The connector as defined in claim 1, wherein said pair of retention bars reserves a sufficient space therebetween for allowing the locking projection to be received therein.

4. The connector as defined in claim 1, wherein said upper ends of the retention bars keep a sufficient distance with regard to the locking projection in a vertical direction when said ejector is in a locking vertical position, for allowing rotatable movement of the ejector with regard to the housing.

5. The connector as defined in claim 1, wherein said upper ends are expansion lugs.

6. The connector as defined in claim 1, wherein said ejector further includes a lever opposite to the locking projection.

7. A card edge connector for use with a card, comprising:
   an insulative elongated housing defining a central slot for receiving said card therein;
   an ejector rotatably positioned adjacent one end of the housing;
   said ejector including a main body having a locking projection extending toward the central slot; and
   a pair of retention bars relatively longer than the ejector, integrally extending upward from the housing and having respective engagement sections at top portions for efficiently sandwiching the card therebetween; wherein
   a sufficiently large space is reserved between said pair of retention bars for allowing the locking projection of the ejector to be rotatably received therein without interference.

8. The connector as defined in claim 7, wherein said locking projection of the ejector is substantially structurally positioned below the engagement sections of the retention bars when said ejector is in a locking vertical condition.

* * * * *